United States Patent [19]

Rimai et al.

[11] Patent Number: 5,411,600
[45] Date of Patent: May 2, 1995

[54] ULTRATHIN FILM THERMOCOUPLES AND METHOD OF MANUFACTURE

[75] Inventors: Donald S. Rimai, Webster; Raymond E. Anne, Caledonia; Raymond C. Bowen, Rochester, all of N.Y.

[73] Assignee: Eastman Kodak Company, Rochester, N.Y.

[21] Appl. No.: 169,686

[22] Filed: Dec. 17, 1993

Related U.S. Application Data

[63] Continuation-in-part of Ser. No. 892,853, Jun. 3, 1992, abandoned.

[51] Int. Cl.$^6$ ............................................. H01L 35/28
[52] U.S. Cl. .................................. 136/225; 136/201; 136/230; 136/241; 374/179; 374/208
[58] Field of Search ............... 136/201, 255, 241, 230; 374/179, 208

[56] References Cited

U.S. PATENT DOCUMENTS

| | | | |
|---|---|---|---|
| 2,798,493 | 7/1957 | Sukacev | 128/379 |
| 2,798,494 | 7/1957 | Sukacev | 128/379 |
| 3,305,393 | 2/1967 | Breckenridge | 117/212 |
| 3,427,209 | 2/1969 | Hager, Jr. et al. | 136/225 |
| 3,979,226 | 9/1976 | Renner et al. | 136/208 |
| 4,091,138 | 5/1978 | Takagi et al. | 428/209 |
| 4,116,791 | 9/1978 | Zega | 204/192 N |
| 4,229,476 | 10/1980 | Forster et al. | 428/201 |
| 4,438,291 | 3/1984 | Eichelberger et al. | 136/236 R |
| 4,544,441 | 10/1985 | Hartmann et al. | 156/634 |
| 4,720,401 | 1/1988 | Ho et al. | 427/250 |
| 4,779,994 | 10/1988 | Diller et al. | 374/29 |
| 4,795,498 | 1/1989 | Germanton et al. | 136/225 |
| 4,850,713 | 7/1989 | Thery et al. | 374/30 |
| 4,963,195 | 10/1990 | Kodato et al. | 136/225 |
| 4,969,956 | 11/1990 | Kreider et al. | 136/201 |
| 5,033,866 | 7/1991 | Kehl et al. | 374/179 |
| 5,087,312 | 2/1992 | Gerber et al. | 136/225 |

OTHER PUBLICATIONS

D. L. Decker et al. entitled "Thermal Properties of Optical Thin Film Materials", NBS Special Publication 727, Laser Induced damage in optical materials 1984, government printing Office, D.C., 1986, pp. 291–297.

J. Clark et al. entitled "Thin Film Thermocouples for Use in Scanning Electron Microscopy," Ninth Annual Symposium, ITT Research Institute, Apr. 1976, pp. 83–90.

V. Damodara Das et al. entitled "Temperature Variation of Thermoelectric Power of Vacuum Deposited PbSe Thin Films and Its Thickness Dependence," Journal of Material Sciences, 1990, pp. 169–174.

An article by P. R. Bevington entitled "Data Reduction and Error Analysis for the Physical Sciences," McGraw-Hill Book Company, 1969, pp. 43–47.

The book entitled "Handbook of Chemistry" by N. A. Lange, McGraw Hill Book Co., Inc., 1961, p. 850.

An article by M. Portat, et al., entitled "Newly Developed Thin Film Transducers and Their Applications," Office National d'Etudes et de Recherches Aerospatiales, Onera Frankeich, pp. 61–77.

Primary Examiner—Donald P. Walsh
Assistant Examiner—Chrisman D. Carroll
Attorney, Agent, or Firm—Willard G. Montgomery

[57] ABSTRACT

Ultrathin film thermocouple devices, which are extremely small in size and thickness and flexible, allow measurement of temperatures during processing of flexible elements which flex during processing. The invention includes temperature measuring devices where the thermocouple is deposited on the flexible element being processed. Such thermocouple devices are useful in a variety of applications where conventional temperature measuring devices can not be used. Such thermocouples devices are made from a variety of thermocouple metals including copper-constantan and copper-nickel and may be fabricated on flexible substrates by evaporation. Detailed fabrication procedures are also described. These devices are surprisingly robust, able to withstand extensive flexing without alteration or deterioration in thermocouple properties, and exhibit thermal EMF's which are reproducible from sample to sample and readily measurable.

1 Claim, 3 Drawing Sheets

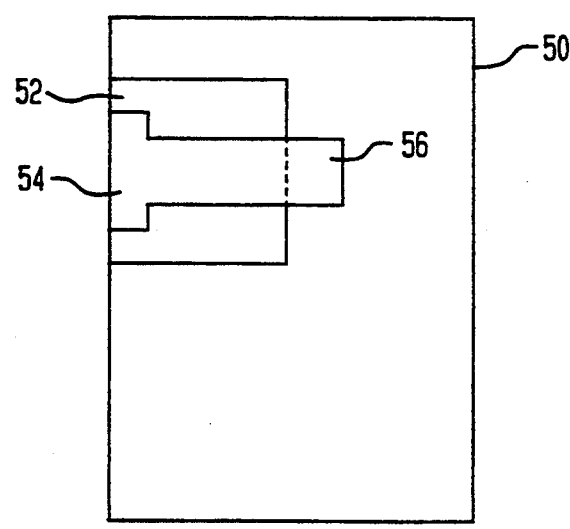

ULTRATHIN FILM THERMOCOUPLES AND METHOD OF MANUFACTURE

CROSS REFERENCE TO RELATED APPLICATIONS

This application is a continuation-in-part of an application Serial No. 07/892,853, filed Jun. 3, 1992, now abandoned.

FIELD OF THE INVENTION

This invention relates to temperature measuring devices and to methods of fabricating such devices.

BACKGROUND OF THE INVENTION

Temperature and thermal conductivity measurements are frequently made in connection with various chemical and physical investigations, in engineering applications as in the optimization of processing parameters, and in determining the properties of various materials. Ordinarily, conventional devices provide perfectly satisfactory measurements of temperature and thermal conductivity, particularly where the bulk size of the sample being measured is large compared to the measuring device and rapid response time is not required. Typical conventional temperature measuring devices are thermometers, conventional thermocouples, pyrometers and thermistors.

In many applications, conventional temperature measuring devices do not provide satisfactory results. Such situations arise where the sample is extremely thin or where the region of interest for measuring the temperature is highly confined (e.g., a thin polymer layer). Also, in many applications rapid response time is required. Such conditions arise in a number of well known processes. For example, in xerography, images are typically fused by passing a toned paper through a pair of heated rollers. Another example is the coating of surfaces with polymer using a melt extrusion process. These processes require accurate determination and control of temperatures in a small, confined region such as a material-substrate interface. In addition, in many applications, temperature measurements are needed within a flexible, electrically insulating, thin layer. Under such circumstances the temperature measuring device should withstand extensive bending without adverse effects. For purposes of this application, electrically insulating layers should typically have an electrical resistivity greater than one ohm cm.

Conventional temperature probes are often too bulky to fit into the region where temperature is to be measured. Moreover, their heat capacities and thermal conductivities are typically so large as to effect measurements on extremely thin samples or where the region of interest is extremely thin. Also, the large mass of conventional probes makes their response times too slow for many applications. Optical techniques including standard pyrometers may also be used to measure temperatures, but these techniques require a direct optical path to the region being measured. Often, such a direct optical path is not available because of the equipment associated with the process of interest.

A number of references have disclosed thin film thermocouples. For example, D. L. Decker et al. in an article entitled "Thermal Properties of Optical Thin Film Materials", NBS Special Publication 727, Laser Induced Damage in Optical Materials 1984, Government Printing Office, D.C., 1986, pp. 291–297, reports the use of chromel/alumel thin film thermocouples in the measurement of thermal conductivity of thin films of aluminum oxide and silicon dioxide on rigid supports. These thermocouples were made by electron beam deposition and had a thickness of 1000 Angstroms.

U.S. Pat. No. 4,795,498 (D. Germanton et al.), issued Jan. 3, 1989, discloses thermocouples made of layers of metal on Mylar sheet which is laminated onto a rigid structure such as paper board. The layers of metal have a thickness between 2000 and 5000 Angstroms and are formed by vapor deposition or vacuum sputtering and requires laying down a layer of varnish between the deposition of the two metals. Bismuth and tin were used as the thermocouple metals. Use of alloys as the thermocouple metal was avoided because the metal deposition process used in the fabrication of the thermocouples alters the composition of the alloy. There is also disclosed a process for fabricating individual thermocouple units of very low cost used primarily as probes for human body temperature measurements.

U.S. Pat. No. 4,779,994 (T. E. Diller et al.), issued Oct. 25, 1988, discloses a heat flux gage employing various thin film layers as thermocouples. This reference exemplifies the prior art at the time of filing of the instant application in that the substrate is rigid so as to prevent breaking of the thin film thermocouple. This reference does not suggest in any way that a durable and reliable ultrathin film thermocouple could be made that was flexible. Similarly, Decker et al., in NBS Special Publication 727, Laser Induced Damage in Optical Materials: 1984 (Government Printing Office, Washington, D.C., 1986), pp. 291-297, describes certain thermal conductivity experiments in which an ultrathin thermocouple is deposited on a sapphire substrate. Again, this reference discloses a rigid thin film temperature measuring device and not a flexible device.

Other references provide valuable background for an understanding of the invention. For example, U.S. Pat. No. 3,305,393 (D. T. Breckenridge), issued Feb. 21, 1967, discloses a method of making a thermopile made up of a plurality of thermocouples connected in series by use of a grooved substrate. Bismuth and nichrome were used as thermocouple metals and these metals were deposited by an evaporation technique.

U.S. Pat. No. 4,091,138 (T. Takagi et al.), issued May 23, 1978), discloses a method of depositing a metal on an insulating surface using a cluster ion plating method. The method is supposed to produce a dense, electrically conductive metallic coating with good adherence without use of an adhesive.

U.S. Pat. No. 4,229,476 (H. Forster et al.), issued Oct. 21, 1980, describes certain thin film electrical circuit components made by using various oxides to provide adherence of the metal film to an insulating substrate such as paper or synthetic resin. U.S. Pat. No 4,720,401 (P.S.C. Ho et al.), issued Jan. 19, 1988, describes a procedure for increasing the adhesion of metals to organic substrates by heating the substrate to a temperature range of about (0.6–0.8) $T_c$ where $T_c$ is the curing temperature of the substrate.

Thin film thermocouples are also disclosed in U.S. Pat. No. 4,963,195 (S. Kodato et al.), issued Oct. 16, 1990. Here, films of silicon-germanium alloy serve as one of the thermocouple leads and a metal conductor as the second thermocouple lead. These thermocouples are used as part of a power detector. Such detectors exhibit good linearity characteristics in the low power range. U.S. Pat. No. 4,969,956, (K. G. Kreider et al.) issued Nov. 13, 1990, describes a transparent thin film thermocouple made with indium tin oxide and indium oxide. These thermocouples are useful for measuring temperature of transparent materials without disturbing their optical properties. U.S. Pat. No. 5,033,866 (T. Kehl et al.), issued Jul. 23, 1991, discloses a multiple thermocouple sensor in which thick film thermocouples are mounted on a carrier plate. These devices are useful in various thermal analysis ovens.

An article entitled "Thin Film Thermocouples for Use in Scanning Electron Microscopy", by Clark et al., Proceeding of the Ninth Annual Scanning Microscope Symposium, ITT Research Institute, April 1976, pp 83–90, discloses extremely thin thermocouples for use in vacuum equipment and scanning electron microscopes. The application described in this article does not require a flexible temperature measuring device and the reference does not describe nor teach a flexible temperature measuring device as that term is usually used and as that term is used in this application. Indeed, the fabrication procedure described in the Clark et al. article shows that the authors believed, as other scientists believed at that time, that ultrathin film thermocouple devices could not be flexed without destroying the device. This is evident from the fact that nylon is first stretched over a rigid holder having a hole therethrough and then thermocouple metal layers are deposited on a portion of the nylon which covers the hole. Thereafter, the nylon is not stretched, flexed (bent) or deformed.

It is desirable to provide a temperature measuring device sufficiently small in size and thickness to measure temperature in confined spaces such as a surface interface and sufficiently robust to remain functional under a variety of conditions including use on a flexible layer, and to provide a temperature measuring device with sufficiently small heat capacity and thermal conductivity so that the measuring device does not affect the temperature measurements even with extremely small samples. It is also desirable to provide a temperature measuring device with sufficiently small mass so that response times are short and to provide a differential temperature measuring device useful for measuring thermal conductivity, phase transitions, etc., on a thin layer of insulating material, particularly a thin flexible layer of insulating material. Such a flexible temperature measuring device might be used in applications where the flexible layer is continuously flexed or bent so as to conform to a nonplanar or irregular surface. For example, often various kinds of processing are carried out on flexible elements such as sheets and the temperature of the flexible elements is an important parameter in the process.

In the art of xerography, the process of thermal assisted transfer is of considerable importance. Here, a thermoplastic bearing receiver sheet is wrapped around a heated roller and fed into a nip formed by the heated roller and a second roller which may or may not be heated. While in the nip, the receiver sheet contacts an image bearing member where the image is formed using certain toners. Toner transfer is accomplished under specified conditions of temperature and pressure. Immediately on exiting the nip, the receiver is separated from the image bearing member, with the image completely transferred to the receiver sheet. The temperature of the receiver sheet is critical to successful transfer of the image. Conventional temperature measuring techniques do not provide such accurate and reliable temperature measurements. The smallest conventional thermocouples are about 10 to 20 micrometers thick. This is much too thick to feed through a nip such as described above without disturbing the nip geometry and can cause damage to the nip material or apparatus. Also, the mass of the device would draw heat away from the receiver surface and result in inaccurate measurements. Other techniques such as infrared pyrometry and other non-contacting methods would not be effective in measuring the temperature within the nip because the geometry of the rollers would interfere with the measuring technique. Similar considerations apply to other processes such as toner fusing where the image is permanently fixed to the receiver (usually paper). Other areas where ultrathin thermocouples are useful are melt extrusion, heat transfer characteristics of polymer coatings, and characteristics of polymer coatings.

It is highly desirable to have a temperature measuring device that can measure the temperature of the flexible elements during processing directly so as to assure high efficiency of the process.

SUMMARY OF THE INVENTION

In accordance with this invention, it has been discovered that ultrathin films of metals and alloys can be formed into thermocouple junctions formed on a flexible electrically insulating substrate to form an ultrathin thermocouple which facilitates an accurate measurement of temperatures. Typical film thicknesses are in the range of 10 to 100 nm, with preferred thicknesses in the range from 25 to 90 nm and even more preferred thicknesses in the range of 45 to 80 nm. The films may be composed of a variety of metals or alloys (collectively called thermocouple metals) including copper-constantan and copper-nickel. It has been discovered that these ultrathin thermocouples can be flexed and bent to conform to a nonplanar and/or irregular surfaces during use thereof without damage to the ultrathin thermocouple. This is particularly advantageous in applications where the temperature of a flexible object is being measured during processing which flexes and/or bends the object. In some applications, such as photocopying, the substrate of the thermocouple is the object (e.g., copy paper) on which the processing is to done and of which the temperature is to be measured.

Viewed from one aspect, the present invention is directed to an ultrathin film thermocouple device. The ultrathin thermocouple device comprises a flexible electrically insulating substrate and first and second thermocouple metals. The first thermocouple metal has a thickness in the range of 10 and 100 nm. The second thermocouple metal has a thickness in the range 10 and 100 nm and overlaps a portion of the first thermocouple metal so as to form a thermocouple junction. The thermocouple junction is in contact with the substrate. The ultrathin film thermocouple device comprising the substrate and the first and second thermocouple metals is sufficiently flexible such that same can bend to conform to a nonplanar surface so as to facilitate measurement of temperature in close proximity to the nonplanar surface and/or to measure temperature of the substrate.

Viewed from another aspect, the present invention is directed to an ultrathin film thermocouple device. The ultrathin thermocouple device comprises a flexible electrically insulating substrate and first and second thermocouple metals. The first thermocouple metal has a thickness in the range of 10 and 100 nm and is in contact with the substrate. The second thermocouple metal has a thickness in the range 10 and 100 nm, overlaps a portion of the first thermocouple metal so as to form a thermocouple junction, and is in contact with the substrate. The ultrathin film thermocouple device comprising the substrate and the first and second thermocouple metals is sufficiently flexible such that same can bend to conform to a nonplanar surface so as to facilitate measurement of temperature in close proximity to the nonplanar surface and/or to measure temperature of the substrate.

Viewed from another aspect, the present invention is directed to an ultrathin film thermocouple device. The ultrathin thermocouple device comprising a flexible metal substrate, an insulating layer located on a portion of the substrate, and a metal layer. The metal layer is on the insulating layer and extends therebeyond to contact the metal substrate so as to form a thermocouple junction. The ultrathin film thermocouple device comprising the substrate, the insulating layer, and the metal layer is sufficiently flexible such that same can bend to conform to a nonplanar surface so as to facilitate measurement of temperature of the substrate or in close proximity to the nonplanar surface.

Viewed from still an other aspect, the present invention is directed to an ultrathin film thermocouple device for measuring temperatures an image receiver sheet is exposed to as same passes through and contacts various surfaces of a copier. The ultrathin film thermocouple device comprises a substrate which is sufficiently thin and flexible so as to be able to pass through and bend to conform to various surfaces of a copier. The first thermocouple metal has a thickness in the range of 10 and 100 nm and is in contact with the substrate. The second thermocouple metal has a thickness in the range 10 and 100 nm, overlaps a portion of the first thermocouple metal so as to form a thermocouple junction, and is in contact with the substrate. The ultrathin film thermocouple device comprising the substrate and the first and second thermocouple metals is sufficiently thin and flexible such that same can pass through and bend to conform to various surfaces of the copier so as to facilitate measurement of temperatures in close proximity or contact with preselected surfaces of the copier as the ultrathin film thermocouple device passes through the copier.

Viewed from still an other aspect, the present invention is directed to an ultrathin film thermocouple device for measuring temperatures of copy paper as same passes through and contacts various surfaces of a copier. The ultrathin film thermocouple device comprises a sheet of copy paper which is sufficient thin and flexible so as to be able to pass through and bend to conform to various surfaces of a copier, and first and second thermocouple metals. The first thermocouple metal has a thickness in the range of 10 and 100 nm and is in contact with the sheet of copy paper. The second thermocouple metal has a thickness in the range 10 and 100 nm, overlaps a portion of the first thermocouple metal so as to form a thermocouple junction, and is in contact with the sheet of copy paper. The ultrathin film thermocouple device comprising the copy paper and the first and second thermocouple metals is sufficiently thin and flexible such that same can pass through and bend to conform to various surfaces of the copier so as to facilitate measurement of temperatures of the sheet of copy paper as same comes in close proximity or contact with preselected surfaces of the copier as the ultrathin film thermocouple device passes through the copier.

Viewed from still another aspect, the present invention is directed to a method of making ultrathin film thermocouple junctions. The method comprising a first step of masking an area of a substrate. A second step is forming a first thermocouple metal onto a portion of the substrate exposed through the mask. A third step is masking a portion of the first thermocouple metal so as to exposed a portion thereof in which a thermocouple junction can to be formed; and a fourth step is forming a second thermocouple metal onto the exposed portion of the first thermocouple metal so as to form a thermocouple junction.

Viewed from still another aspect, the present invention is directed to a method of measuring the temperature of a flexible electrically insulating substrate as the substrate is brought into close proximity or contact with a plurality of surfaces of processing apparatus with at least one of the surfaces being nonplanar. The method comprises the steps of forming a first thermocouple metal having a thickness in the range of 10 and 100 nm on the substrate; and forming a second thermocouple metal having a thickness in the range 10 and 100 nm, which overlaps a portion of the first thermocouple metal so as to form a thermocouple junction, on the substrate.

Viewed from another aspect, the present invention is directed to a method of forming ultrathin thermocouple junctions. The method comprises a first step of masking an area of a substrate to prevent deposition of metal on said area. A second step is evaporating a first thermocouple metal onto the portion of the substrate exposed through the mask. A third step is moving the mask so that only a junction region of the first thermocouple metal is exposed. A fourth step is cleaning the junction region by exposing said junction region to an electric discharge following by a stream of dry inert gas; and a fifth step is evaporating a second thermocouple metal onto the junction region of the first thermocouple metal so as to form a thermocouple junction.

The invention will be better understood from the following more detailed description taken in conjunction with the accompanying drawings and claims.

BRIEF DESCRIPTION OF THE DRAWING

FIG. 5 shows a top view of an other ultrathin film thermocouple in accordance with the present invention.

DETAILED DESCRIPTION

Figure 1:
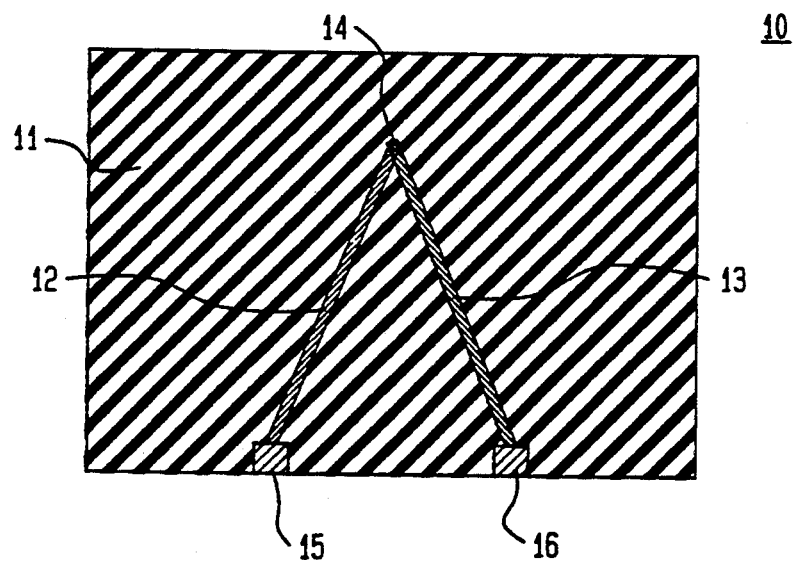
FIG. 1 shows a top view of an ultrathin film thermocouple on an insulating support made in accordance with the present invention.

The present invention is based on the discovery that ultrathin layers of thermocouple metals and alloys (collectively called thermocouple metals) can be formed into thermocouples that are extremely durable and exhibit sufficiently large thermal electromotive forces (EMF's) for precise temperature measurements. Thermocouples in accordance with the present invention are typically formed on flexible substrates such as polyimide sheet (Kapton-H ™), polystyrene overcoated paper, and graphic arts paper (Potlatch vintage velvet TM).

These thermocouples may be produced in a variety of procedures well known in the art, but best results are obtained by a vacuum evaporation procedure. This procedure minimizes damage to the surface (particularly polymer surfaces) so that measurements are carried out on the material of interest and not a surface altered by damage. Second, the evaporation procedure ensures that the thermocouple is located on the surface being measured and not embedded inside the surface as is the case with an electron beam deposition procedure.

Various conventional evaporation procedures may be used to produce the thermocouples. A mask is prepared to allow simultaneous fabrication of a number of individual thermocouples on a given substrate. The mask is designed in such a manner that, after deposition of the first metal, it could be moved to provide appropriate shielding for the evaporation of the second metal and insure partial overlap with the first metal. It is advantageous to carry out the evaporation of the two thermocouple metals sequentially without exposing the first metal evaporated to ambient atmosphere. Also, a cleaning procedure may be used on the portion of the first metal layer to be contacted with the second metal layer to insure good electrical contact.

A typical evaporation procedure is as follows: The evaporation is performed in an 18 inch diameter glass bell jar under a $5 \times 10^{-5}$ um vacuum. All removable chamber parts are first bead blasted. After reassembling, chrome is first evaporated onto the clean surfaces to ensure a virgin environment. A wire of the metal to be evaporated is placed in a boat comprised of a 0.5 inch $\times$ 4.0 inch tungsten ribbon. The sample is mounted at a height of approximately 21.5 inches above the boat and is rotated, during the evaporation process, at a rate of 0.2 rps.

It is advantageous to monitor the evaporation rate during the evaporation process. This is conveniently done by use of an Inficon IC 6000 coating monitor with a silver coated crystal located at a height of approximately 21.5 inches above the boat. Slow evaporation rates are preferred, particularly when polymeric substrates are used so as to avoid heat from the evaporated metal softening the polymer. Typical evaporation rates are in the range from 3 to 5 Angstroms per second. While under low vacuum conditions, it is highly advantageous to subject the samples to a surface cleaning procedure. Typically, this cleaning procedure consists of subjecting the surface to an electric discharge and a blast of dry nitrogen.

Although single thermocouples can be made in this way, usually it is more efficient economically to make an array of thermocouples on each evaporation procedure. Also, differential thermocouples can be made in this way by arranging the thin films of thermocouple metal so that two thermocouple junctions are electrically connected in parallel. Differential thermocouples are extremely useful for measuring temperature differences between two spacial regions since the voltage measured is proportional to this temperature difference. In addition, thin film thermocouple piles are easily constructed on a flexible substrate by evaporating several thermocouple junctions and arranging the metal thin films so that the thermocouple junctions are electrically connected in series. Such a device is an extremely sensitive temperature sensor.

The thermocouples are made extremely thin to ensure good flexibility characteristics, low thermal conductivity and rapid response times. Typical thicknesses are in the range of 10 to 100 nm. Thicknesses less than 10 nm might exhibit electrical discontinuities; thicknesses over 100 nm tends to increase thermal conductivity and response times without necessarily improving thermocouple performance. In addition, the thicker layers may be more subject to cracking when the substrate is flexed. Thicknesses in the range of 25 to 90 nm are preferred with thicknesses in the range of 45 to 80 being most preferred. The temperature measuring element should be sufficiently flexible to be bent about a cylinder having a radius as small as 1 mm such that same can conform to nonplanar and irregular as well as planar surfaces. A larger radius is of course possible. The flexibility parameters are used to define the flexibility characteristics of the thermocouple temperature measuring devices as a whole but in actual use, the devices may be required to conform to a completely irregular surface rather than the surface of a cylindrical roller of a particular radius of curvature.

In some applications where thermal conductivity or response time is to be as low as possible, it is advantageous to minimize the width of the thermocouple metal film without having discontinuities in the electrical conduction path. Film widths in a range of 10 and 100 microns are preferred under these circumstances.

An important aspect of the invention is where the substrate of the temperature measuring device is a flexible element which undergoes some kind of processing where the temperature of the flexible element (e.g., a sheet of paper or plastic) is a critical parameter in the processing. Here, the thermocouple metals are deposited on the flexible element and the temperature measured during processing. For example, in xerography, the temperature measuring device comprises the thermocouple metal layers deposited on paper or other polymer sheet. In essence, the temperature measuring device becomes the flexible element undergoing processing.

The temperature response of the thin film thermocouple is either monitored continuously or at specific intervals. The output voltage is measured using standard techniques such as conventional voltage meters, strip chart recorders, A-D converters for use in data acquisition systems or computers. The output voltage of these devices are measured in a variety of ways. For example, long leads are attached to the thermocouple on the substrate to allow electrical wires to be attached to these leads. Also, voltage measurements can be made using electrically conducting brushes in contact with thermocouple leads. Induction measurement techniques are also useful.

These thermocouples exhibit extreme durability under a variety of tests, particularly tests involving bending and heating. For example, on exposure to repeated cycles through a pressure nip formed by pairs of heated rollers, these thermocouples showed no degradation in performance or reliability. In addition, rapid temperature cycling between 0 degrees C and 100 degrees C or bending on heated cylinders did not alter the characteristics of these thermocouples.

FIG. 1 shows a top view of a typical ultrathin film thermocouple device 10 in accordance with the present invention. For purposes of illustration, copper and constantan are used as the thermocouple metals. The thermocouple is formed on a flexible substrate 11 and comprises a copper layer 12 and a nickel layer 13 and an area of overlap 14. The area of overlap 14 is the thermocouple junction where thermoelectric voltage is generated and where the temperature is measured. Each thermocouple metal layer 12 and 13 is provided with a contact pad or beam lead 15 and 16.

Figure 2:
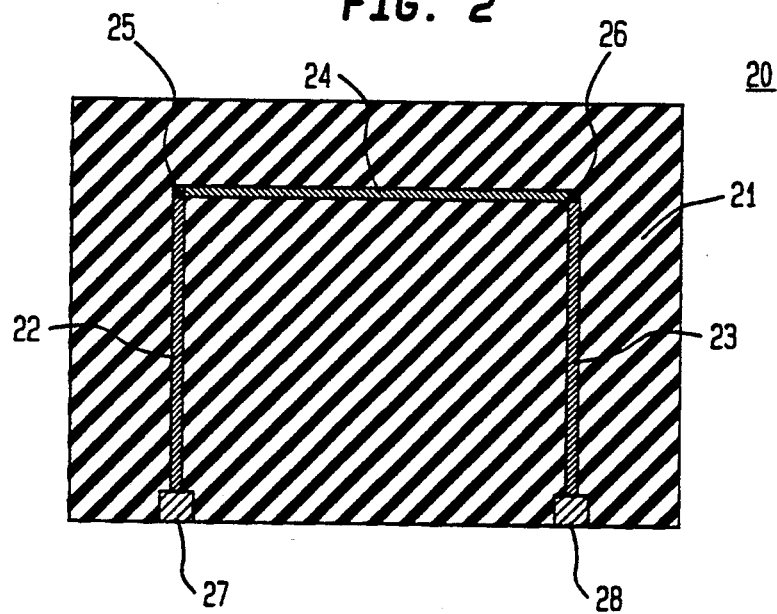
FIG. 2 shows a top view of an ultrathin film differential thermocouple made in accordance with the present invention.

FIG. 2 shows a top view of a differential ultrathin thermocouple device 20 in accordance with the present invention. The differential ultra thin thermocouple device 20 is formed on a flexible substrate 21 and is made up of two regions of thin copper film 22 and 23, and one region of thin film nickel 24. Each region of the thin copper films 22 and 23 partially overlaps and is in electrical contact with separate parts of the nickel thin film region 24 to form separate thermocouple junctions 25 and 26 of the differential thermocouple 24. Contact pads or beam leads 27 and 28 are provided to facilitate electrical contact to ends of films 22 and 23, respectively. Such differential thermocouple structures are useful for thermal conductivity measurements of thin films such as flexible polymer thin films and to study phase transitions in flexible thin films.

An important aspect of the invention is that the thermally induced EMF's of the ultrathin thermocouples, while often not as large as that found in the bulk material, is large enough to yield excellent temperature measurements. For example, in the case of copper/constantan ultra thin film thermocouples, the response is about 3 microvolts/degree C, or about 10% of the expected response of a standard copper/constantan thermocouple. The response does not vary with the thermocouple thickness between 25 and 100 nm. At least part of the low response is due to an unexpectedly low percentage of nickel in the constantan film due to fractional distillation of the constantan during the evaporation process. Indeed, electron beam analysis of the thermocouple film shows a lower concentration of nickel than is present in bulk constantan. To avoid this difficulty, some thermocouples were made using metallic elements as the thermocouple metals rather than alloys.

Figure 3:
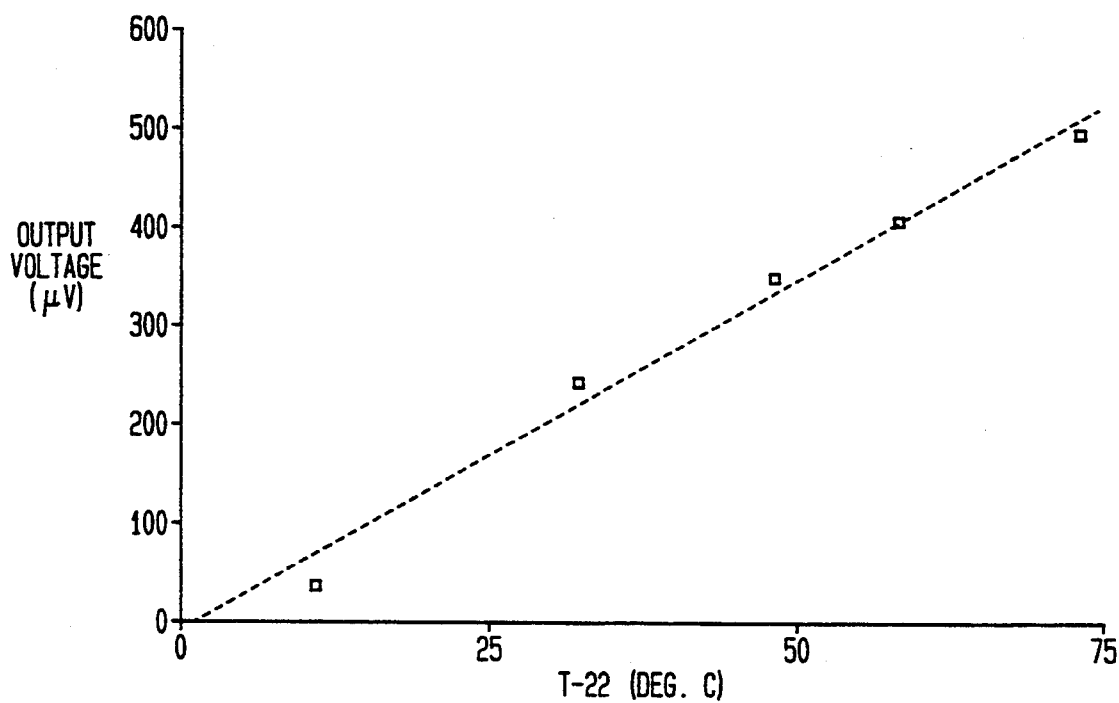
FIG. 3 shows in graphical form thermal response of an ultrathin copper-nickel thermocouple as a function of temperature.

FIG. 3 presents data in graphical form of the output voltage of a copper/nickel thermocouple made in accordance with the invention as a function of temperature. Output voltage is plotted on the y-axis in units of microvolts (uv). Since the thermocouple is referenced to ambient temperature (22 Degrees C), temperature minus 22 is plotted on the x-axis in units of Deg. C.

The thermal EMF of the copper/nickel thermocouple is about 7 microvolts per degree C., a quantity sufficiently large for extremely accurate temperature measurements but only about ⅓ that found for standard copper/nickel thermocouples. The relationship between thermal EMF and temperature of a particular thermocouple is stable and does not change with temperature cycling. However, a calibration should be carried out to ensure accurate temperature measurements. The difference between the sensitivities of thin film and bulk thermocouples probably arises from the fact that the Peltier and Seeback effects, which give rise to the thermoelectricity, are bulk properties. The theory for thin film thermoelectric effects has not been developed as yet.

Other thermocouple metals may be used in the practice of the invention. Any material or combination of materials may be used that exhibits the thermocouple effect (a thermal EMF). Materials that have constant composition under evaporation procedures (e.g., metal elements) and have large thermal EMFs are preferred. Typical thermocouple metals are gold, gold/platinum alloy, gold/palladium alloy, platinum/palladium alloy silver, silver/palladium alloy, silver/platinum alloy chromel, alumel, iron, rhodium, tungsten/rhenium alloy, and ferrous/nickel alloy.

Figure 4:
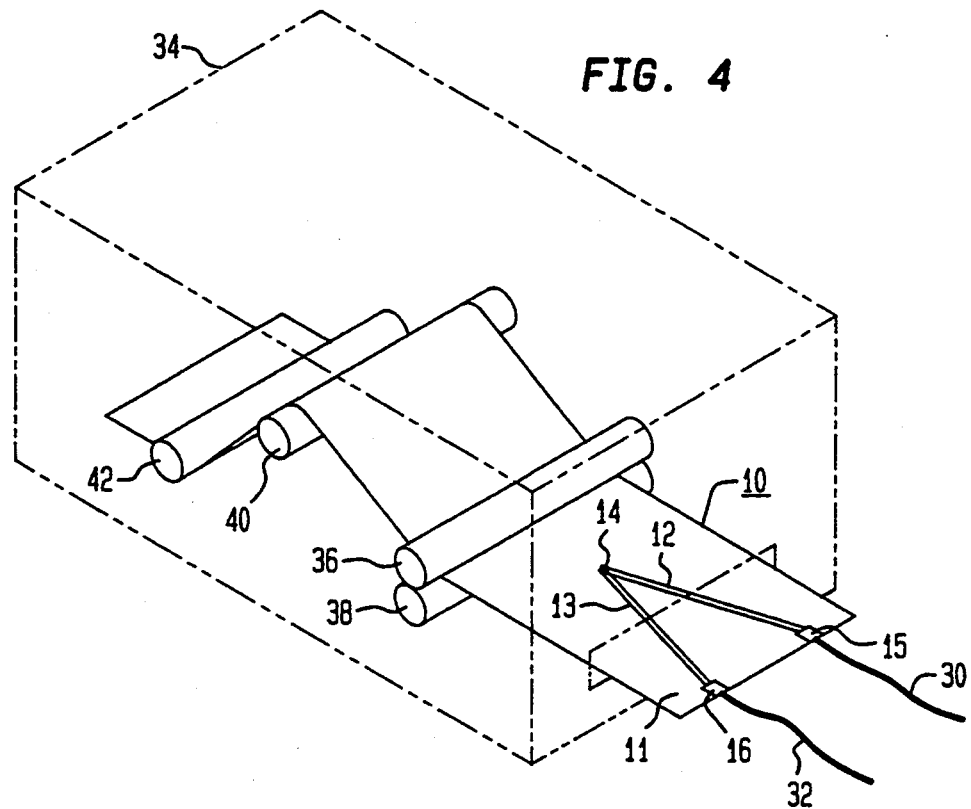
FIG. 4 shows the thermocouple of FIG. 1 being used with a copier.

Referring now to FIG. 4, there is shown the ultra thin thermocouple device 10 of FIG. 1 with electrical leads 30 and 32 connected to terminals 15 and 16, respectively. Ultra thin thermocouple device 10 is shown passing through a portion of a copier 34 (shown schematically as a rectangular box) which includes rollers 36, 38, 40, and 42. The substrate 11 of thermocouple 10 is in this embodiment copy paper on which an image (not shown) can be formed by copier 34. Copy paper 11 is shown passing between rollers 36 and 38 (which may be fusing rollers), over roller 40 and then under roller 42. Thus copy paper 11 is subjected to bending over rollers and thus passes nonplanar and/or planar surfaces during the time it passes through copier 34. The thermocouple junction 14 is shown on a portion of copy paper 11 just before it enters copier 34 so as to make it easier for one to see thermocouple junction 14.

As copy paper 11 passes through copier 34, it is heated at various points and the temperature of copy paper 11 is measured via thermocouple junction 14 which generates a voltage proportional to the temperature of copy paper 11. This voltage is measured by a variety of conventional means (not shown) (e.g., voltage meters) and is converted to temperature readings. Copy paper 11 could be held in place in a portion of copier 34 and the temperature of thermocouple junction 14 would then represent essentially the temperature of copy paper 11 and of the portion of the copier 34 where the copier paper 11 is located. In the context of a copier, it is typically useful to know the temperature of piece of copy paper reaches as it passes through various portions of the copier in order to obtain a good image formed on the paper. The temperature of a particular portion of the copier may be higher or lower than that of the copy paper passing therethrough depending of the speed at which the copier paper passes through the copier.

Referring now to FIG. 5, there is shown an ultrathin film thermocouple device 48 in accordance with the present invention. Device 48 comprises a flexible metal substrate 50, an insulating layer 52 on a portion of substrate 50, and a metal layer 54. Metal layer 54 is on a portion of insulating layer 52 and extends therebeyond so as to contact a portion of substrate 50 so as to form a thermocouple junction 56. In a typical embodiment, substrate 50 is nickel and metal layer 54 is copper. Metal layer 54 typically has a thickness of 10 to 100 nm. Insulating layer 52 is selected to be a thin as possible so as to facilitate good electrical isolation between portions of metal layer 54 on insulating layer 52 and portions of substrate 50 therebelow. In a typical application, substrate 50 is a ferrotyping web of nickel which is used to cast a finish on thermoplastics. Thermocouple device 50 facilitates determining temperature the web is exposed to as it rotates. In this application the thickness of the substrate (web) 50 is selected so as to allow the web 50 to function as is required. Accordingly, the web 50 can have a thickness in the range of 10 to 100 nm or can be considerably thicker.

The invention has been described in detail with particular reference to certain preferred embodiments thereof, but it will be understood that variations and modifications can be effected within the spirit and scope of the invention. For example, the flexible metal substrate 50 of FIG. 5 can be formed on an electrically insulating substrate with the resulting structure still being thin enough to allow performance without adversely affecting process conditions.

What is claimed is:

1. An ultrathin film thermocouple device for measuring temperatures of a sheet of copy paper as same passes through and contacts various surfaces of a copier, the ultrathin film thermocouple device comprising:

a sheet of copy paper;

a first thermocouple metal having a thickness in the range of 10 and 100 nm and being in contact with the sheet of copy paper;

a second thermocouple metal having a thickness in the range 10 and 100 nm, overlapping a portion of the first thermocouple metal so as to form a thermocouple junction, and being in contact with the sheet of copy paper; and the ultrathin film thermocouple device comprising the sheet of copy paper and the first and second thermocouple metals being sufficiently thin and flexible such that it can be bent to a radius of approximately 1 millimeter such that it can pass through and bend to conform to various surfaces of the copier so as to facilitate measurement of temperatures of the sheet of copy paper as same comes in close proximity or contact with preselected surfaces of the copier as the ultrathin film thermocouple device passes through the copier.

* * * * *